United States Patent
Sekiguchi et al.

(10) Patent No.: US 7,508,243 B2
(45) Date of Patent: Mar. 24, 2009

(54) TRIANGULAR WAVE GENERATION CIRCUIT

(75) Inventors: Yasuhiro Sekiguchi, Hyogo (JP); Masaki Hirōmōri, Kawasaki (JP)

(73) Assignees: Fujitsu Ten Limited, Kobe (JP); Fujitsu Limited, Kawasaki (JP)

( * ) Notice: Subject to any disclaimer, the term of this patent is extended or adjusted under 35 U.S.C. 154(b) by 58 days.

(21) Appl. No.: 11/657,683

(22) Filed: Jan. 25, 2007

(65) Prior Publication Data

US 2007/0182464 A1    Aug. 9, 2007

(30) Foreign Application Priority Data

Jan. 31, 2006   (JP)  ............................. 2006-022219

(51) Int. Cl.
*H03K 4/06*   (2006.01)
(52) U.S. Cl. ................. 327/131; 327/133; 327/137; 327/140
(58) Field of Classification Search ............ 327/131, 327/133, 137, 140
See application file for complete search history.

(56) References Cited

U.S. PATENT DOCUMENTS

| | | | | |
|---|---|---|---|---|
| 3,932,741 A | | 1/1976 | Hanson | |
| 4,486,646 A | * | 12/1984 | Frazier | ..................... 219/130.1 |
| 4,585,951 A | * | 4/1986 | Wurzburg | ..................... 327/140 |
| 4,611,176 A | * | 9/1986 | Jatko et al. | ..................... 327/133 |
| 5,013,931 A | * | 5/1991 | Estes, Jr. | ..................... 327/140 |
| 7,183,818 B2 | * | 2/2007 | Tsuji | ........................... 327/132 |
| 7,271,632 B2 | * | 9/2007 | Cottin et al. | ................. 327/131 |
| 2003/0155957 A1 | | 8/2003 | Beier | |

FOREIGN PATENT DOCUMENTS

| | | | |
|---|---|---|---|
| JP | A 62-152214 | 7/1987 |
| JP | A 5-338258 | 12/1993 |
| JP | A 6-339014 | 12/1994 |

* cited by examiner

*Primary Examiner*—Kenneth B. Wells
(74) *Attorney, Agent, or Firm*—Oliff & Berridge, PLC

(57) ABSTRACT

An accurate intermittent triangular wave signal without waveform distortion is generated by a triangular wave generation circuit 1 including a rectangular wave generation circuit 111 for generating an intermittent rectangular wave signal in which a rectangular wave interval and a direct current interval of a predetermined level are repeated; an integration circuit 12 for generating an intermittent triangular wave signal in which a triangular wave interval and a direct current interval are repeated based on a reference signal and the intermittent rectangular wave signal generated by the rectangular wave generation circuit 111; and a triangular wave correcting circuit 112 for correcting waveform distortion of the intermittent triangular wave signal based on a differential voltage between a starting point and an ending point of the direct current interval of the intermittent triangular wave signal output from the integration circuit 12.

6 Claims, 14 Drawing Sheets

TRIANGULAR WAVE GENERATION CIRCUIT

BACKGROUND OF THE INVENTION

1. Field of the Invention

The present invention relates to triangular wave generation circuits including a rectangular wave generation circuit for generating an intermittent rectangular wave signal in which a rectangular wave interval and a direct current interval of a predetermined level are repeated, and an integration circuit for generating an intermittent triangular wave signal in which a triangular wave interval and the direct current interval are repeated based on a reference signal and the intermittent rectangular wave signal generated by the rectangular wave generation circuit, in particular, to a triangular wave generation circuit, mounted on a vehicle for the purpose of measuring distance between cars, for generating a frequency modulated signal in an FM-CW radar capable of measuring the relative speed and the distance with respect to a target object.

2. Description of the Related Art

Conventionally, the intermittent triangular wave signal in which the triangular wave interval and the direct current interval are repeated is generated as the frequency modulated signal by the integration circuit using an operational amplifier in which the reference signal is input to the non-inverted input terminal and the intermittent rectangular wave signal in which the rectangular wave interval and the direct current interval of a predetermined level are repeated is input to the inverted input terminal, as shown in FIG. 13.

The triangular wave generation circuit as disclosed in Japanese Laid-Open Patent Publication No. 62-152214 has been proposed for such triangular wave generation circuit, which triangular wave generation circuit removes the offset generated in the generated triangular wave by interposing a capacitor in the output circuit.

However, the reference signal is generated by resistance dividing the power supply voltage in the conventional integration circuit described above, and thus the influence caused by variation of the power supply voltage is significant, and in addition to the generation of the offset in the triangular wave generated by the integration circuit, the output signal of the integration circuit drifts either upward or downward since the reference signal level and the signal level of the direct current interval of the intermittent rectangular wave signal are different, whereby waveform distortion occurs in the intermittent triangular signal to be output, as shown in FIG. 14.

If the intermittent triangular wave signal output from such triangular wave generation circuit is used as the frequency modulated signal in the FM-CW radar and the like, the error of the detecting target becomes large, and may greatly influence various controls that are based on the relevant output.

Furthermore, since the above problem also arises due to external factors such as temperature characteristic of the integration circuit in addition to flaws in circuit design, the frequency and the size of the waveform distortion become irregular, and a stable triangular wave generation cannot be performed by simply making modifications on the circuit design such as adding a capacitor etc.

SUMMARY OF THE INVENTION

The present invention, in view of the conventional problems, aims to provide a triangular wave generation circuit for generating an accurate intermittent triangular wave signal without waveform distortion.

In order to achieve the above, the triangular wave generation circuit of the present invention is a triangular wave generation circuit including a rectangular wave generation circuit for generating an intermittent rectangular wave signal in which a rectangular wave interval and a direct current interval of a predetermined level are repeated; and an integration circuit for generating an intermittent triangular wave signal in which a triangular wave interval and a direct current interval are repeated based on a reference signal and the intermittent rectangular wave signal generated by the rectangular wave generation circuit; where a triangular wave correcting circuit for correcting waveform distortion of the intermittent triangular wave signal based on a differential voltage between a starting point and an ending point of the direct current interval of the intermittent triangular wave signal output from the integration circuit is further arranged.

Furthermore, other inventions should become apparent with reference to the following examples.

DESCRIPTION OF THE PREFERRED EMBODIMENTS

The embodiment in which the triangular wave generation circuit according to the present invention is applied to the FM-CW (Frequency Modulated Continuous Wave) radar will now be described.

The FM-CW radar is mounted to a front bumper, an engine room, a rear bumper or the like of a vehicle, and is used as reference data for track travel controlling based on the distance with another vehicle traveling in front of the relevant vehicle, or as reference data for determining the danger of collision by another car traveling behind the relevant vehicle etc.

Figure 2:
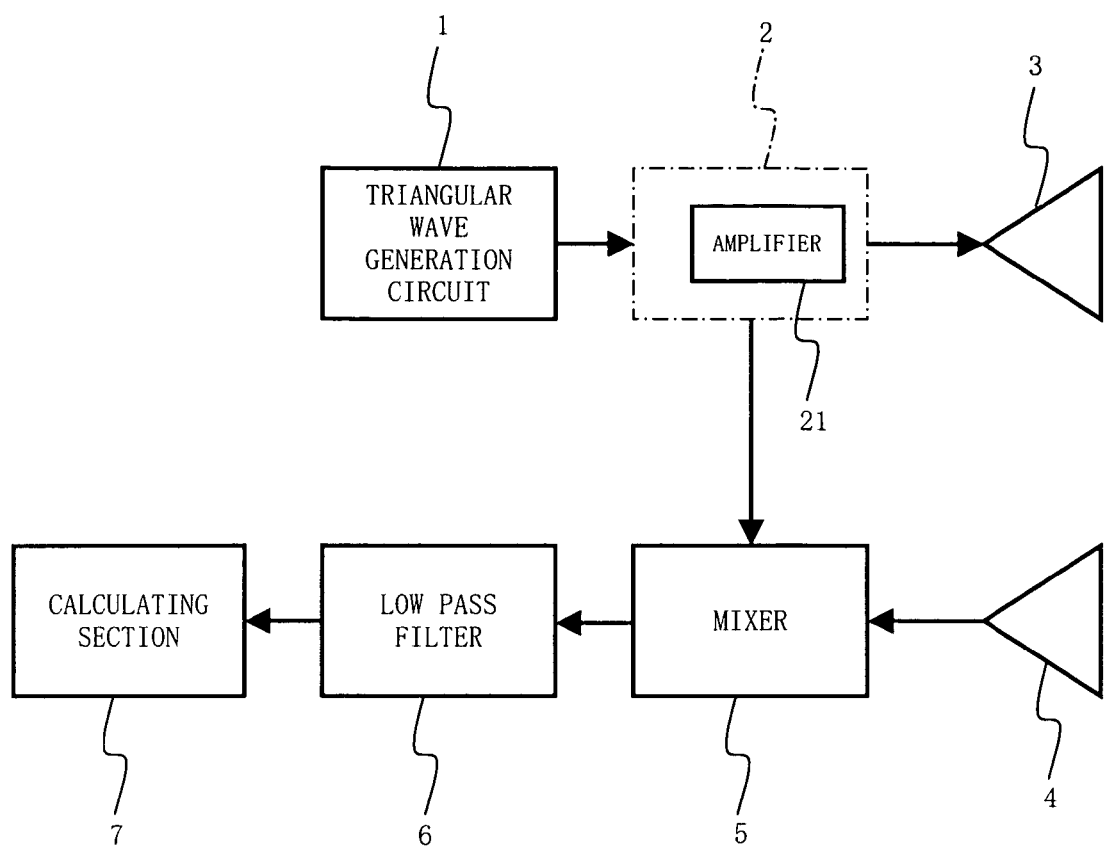
FIG. 2 is a function block configuration diagram of a FM-CW radar.

The FM-CW radar is configured by a triangular wave generation circuit 1 for generating an intermittent triangular wave signal in which the triangular wave interval and the direct current interval are repeated; a divider 2 for dividing the generated intermittent triangular wave signal into a transmitting signal and a local signal; a transmitting antenna 3 for radiating the transmitting signal to an automobile and the like serving as an external target object; a receiving antenna 4 for receiving the transmitting signal reflected by the target object as received signal; a mixer 5 for mixing the received signal and the local signal; a low pass filter 6 for detecting only the fundamental wave component (beat signal) from the mixed signal output by the mixer 5; and a calculating section 7 for calculating the speed v of the target object and the distance R to the target object from the beat signal, as shown in FIG. 2.

The local signal wave divided in the divider 2 is one part of the transmitting signal, and is amplified in an amplifier 21 and output to the mixer 5.

Figure 3A:
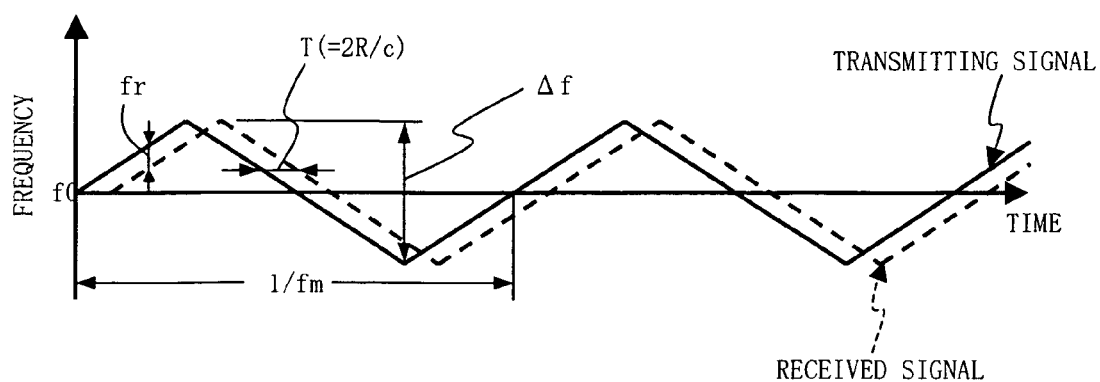
FIG. 3A is an explanatory view showing a transmitting signal and a received signal in the FM-CW radar.
Figure 3B:
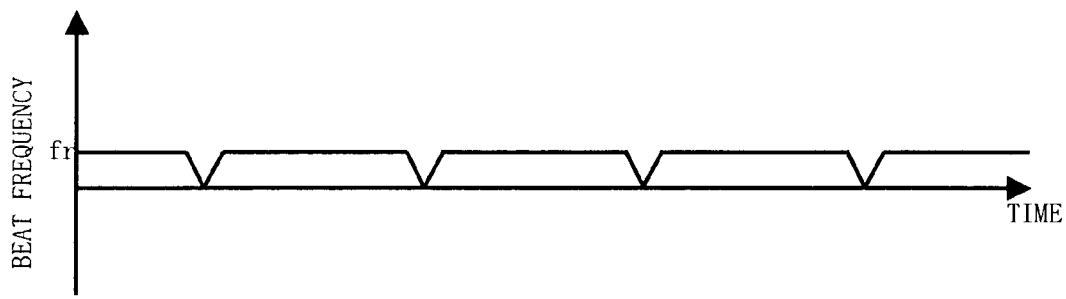
FIG. 3B is an explanatory view showing a beat signal in the FM-CW radar.

The beat signal detected by the low pass filter 6 is a signal such as shown in FIG. 3B having the difference between the transmitting signal and the received signal as the beat frequency fr shown in FIG. 3A. In FIG. 3A, R is the distance to the target object, c is the speed of light, Δf is the frequency deviation width, f0 is the central frequency of the transmitted wave, and fm is the frequency of the modulated signal.

Figure 4:
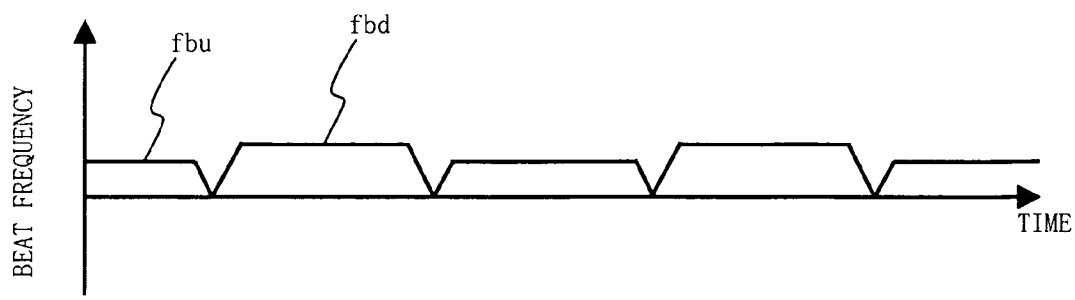
FIG. 4 is an explanatory view showing a beat signal of when the target object is moving.

The beat signal of when the target object is moving is such in which Doppler frequency is superimposed on the beat signal by Doppler effect, as shown in FIG. 4, where the rising beat frequency fbu of the signal rising interval and the falling beat frequency fbd of the signal falling interval are different frequencies.

The speed v of the target object and the distance R to the target object are calculated in the following manner in the calculating section 7. That is, the rising beat frequency fbu of the signal rising interval and the falling beat frequency fbd of the signal falling interval of the modulation cycle of the beat signal detected in the low pass filter 6 are substituted to [Eq. 1] and [Eq. 2] to obtain the Doppler frequency fd based on the target object beat frequency fr when the relative speed of the target object is zero and the relative speed of the target object, and the target object beat frequency fr and the Doppler frequency fd are substituted to [Eq. 3] and [Eq. 4] to calculate the distance R to the target object and the speed v of the target object.

$$fr = \frac{(fb1 + fb2)}{2} \quad [\text{Eq. 1}]$$

$$fd = \frac{(fb2 - fb1)}{2} \quad [\text{Eq. 2}]$$

$$R = \frac{c \cdot fr}{4 \cdot \Delta f \cdot fm} \quad [\text{Eq. 3}]$$

$$v = \frac{c \cdot fd}{2 \cdot f0} \quad [\text{Eq. 4}]$$

Figure 1:
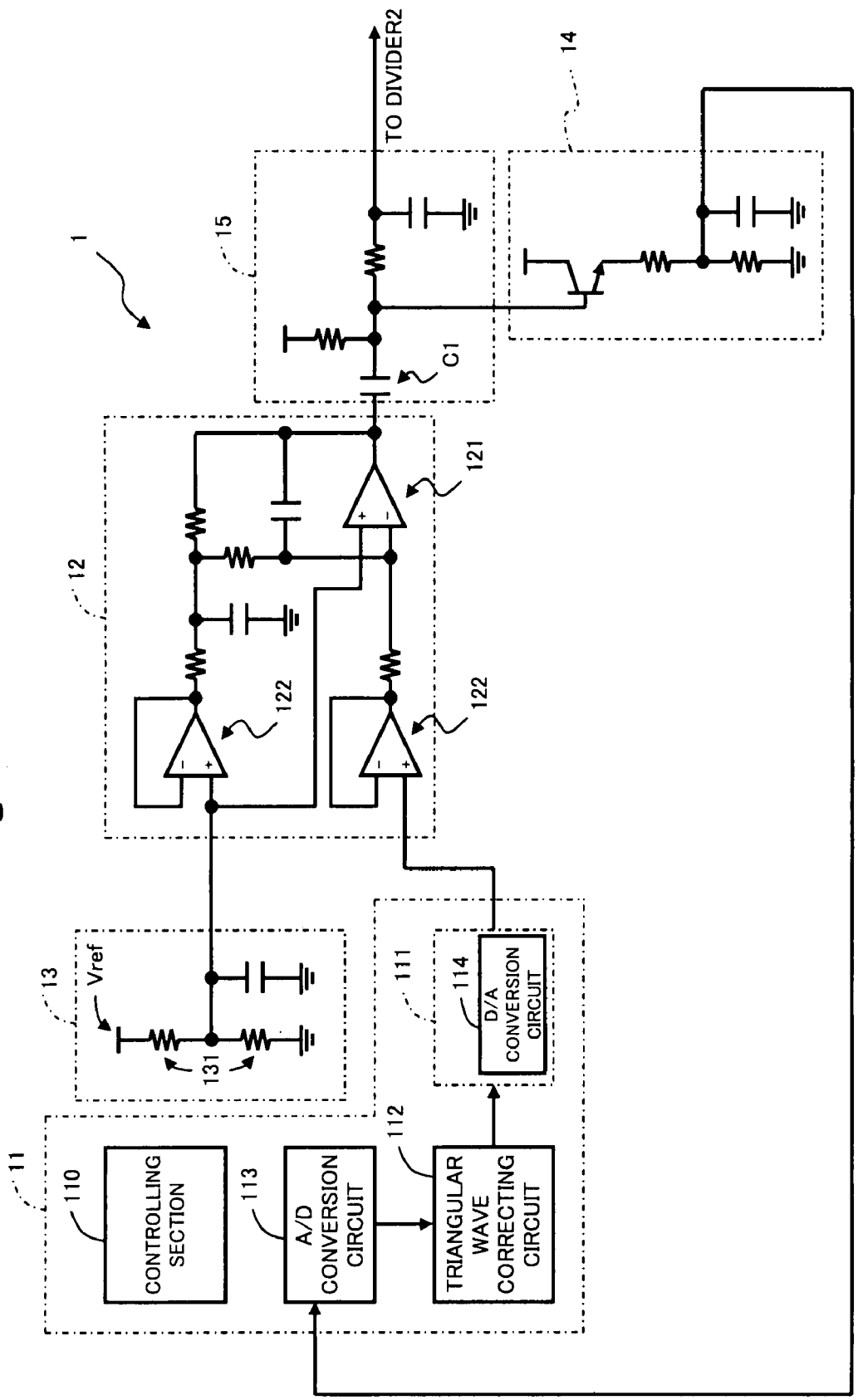
FIG. 1 is a function block configuration diagram of a triangular wave generation circuit.

The triangular wave generation circuit 1, which is the main part of the present invention, will now be described. As shown in FIG. 1, the triangular wave generation circuit 1 is configured by a micro-computer 11 for performing control of the entire operation in the triangular wave generation circuit 1 and generation of the intermittent rectangular wave; an integration circuit 12 for integrating the input constituted by the intermittent rectangular wave and outputting the resultant as the intermittent triangular wave; a reference voltage generation circuit 13 for generating the reference voltage that becomes a reference when integrating the intermittent triangular wave in the integration circuit 12; an output feedback circuit 14 for feeding back the output of the integration circuit 12 to the micro-computer 11; and an output circuit 15 for performing the removal process of the direct current component as a pre-stage of sending the output of the integration circuit 12 to the divider 2.

The micro-computer 11 is configured by a controlling section 110 for controlling the operation of the triangular wave generation circuit 1, a rectangular wave generation circuit 111 for generating the intermittent rectangular wave signal, a triangular wave correcting circuit 112 for correcting the waveform distortion of the intermittent triangular wave to be hereinafter described, and an A/D conversion circuit 113 for converting the input analog signal to a digital signal.

The rectangular wave generation circuit 111 generates the intermittent rectangular wave signal in which the rectangular wave interval and the direct current interval of a predetermined level are repeated as the digital signal for example by decomposing the rectangular wave having a deviation width of 3V by 10 bits. Furthermore, a D/A conversion circuit 114 for converting the intermittent rectangular wave signal serving as the digital signal to an analog signal to be used in the integration circuit 12, as hereinafter described, is also arranged.

The triangular wave correcting circuit 112 and the A/D conversion circuit 113 will be hereinafter described.

The integration circuit 12 may have a circuit configuration that employs an operational amplifier 121 in which the reference voltage is input to the non-inverted input terminal and the intermittent rectangular wave signal is input to the inverted input terminal, as shown in FIG. 1. In the configuration shown in FIG. 1, a voltage follower 122 is interposed as a buffer to prevent adverse effect between the micro-computer 11 and the integration circuit 12.

Figure 5:
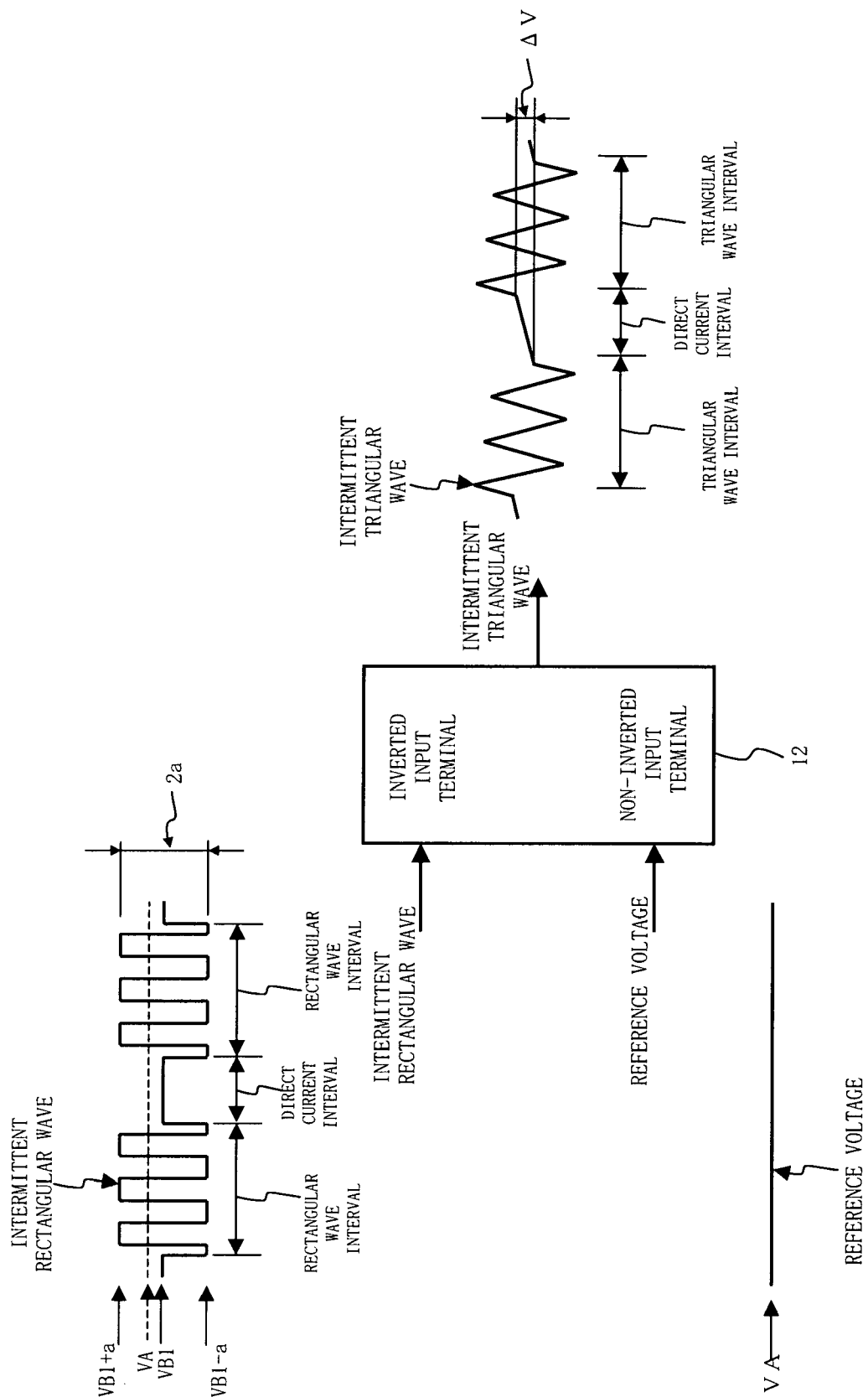
FIG. 5 is an explanatory view showing the intermittent triangular wave output when the intermittent rectangular wave before correction is input to the integration circuit.

The reference voltage generation circuit 13 may be configured with a circuit of generating the reference voltage by voltage dividing the power supply voltage Vref of 5V, 12V and the like with a resistor 131, and connecting the same to the integration circuit 12 of post-stage, as shown in FIG. 5.

The output feedback circuit 14 is a circuit for feeding back the intermittent triangular wave signal, which is the analog signal of the integration circuit 12, to the micro-computer 11, and may have a circuit configuration shown in FIG. 1 and the like. The intermittent triangular wave signal fed back to the micro-computer 11 through the output feedback circuit 14 is converted from the analog signal to the digital signal by the A/D conversion circuit 113 inside the micro-computer 11.

As shown in FIG. 1, the direct current component is removed before the output of the integration circuit 12 is sent to the divider 2 by the output circuit 15 in which a capacitor C1 is arranged at the post-stage of the integration circuit 12.

The triangular wave correcting circuit 112 will now be described. The triangular wave correcting circuit 112 performs a correction such that the signal level of the direct current interval of the intermittent rectangular wave generated in the rectangular wave generation circuit 111 becomes equal to the reference voltage to correct the waveform distortion of the intermittent triangular wave signal based on the differential voltage between the starting point and the ending point of the direct current interval in the intermittent triangular wave signal fed back to the micro-computer 11 by the output feedback circuit 14.

If difference in signal level is created between the signal level of the direct current interval of the intermittent rectangular signal, which is the input of the integration circuit, and the signal level of the reference signal, the differential voltage is generated at the signal level of the starting point and the ending point of the direct current interval of the intermittent triangular wave signal output from the integration circuit when the difference in signal level is integrated by the integration circuit. The differential voltage is generated based on the difference in the signal level of the inputs, and thus the waveform distortion of the intermittent triangular wave signal can be corrected by changing the signal level of the input to the integration circuit based on the differential voltage or the output from the integration circuit.

For example, when the intermittent rectangular wave in which the signal level of the direct current interval is VB1 and the deviation width of the rectangular wave interval is $2a$, and the reference voltage in which the signal level is VA are input to the integration circuit 12, the intermittent triangular wave signal in which the differential voltage between the starting point and the ending point of the direct current interval is $\Delta V$ is output according to the difference between the signal level VB1 of the direct current interval of the intermittent rectangular wave and the signal level VA of the reference voltage, as shown in FIG. 5.

In this case, the triangular wave correcting circuit 112 performs the correction of adding or subtracting the value, which is obtained by multiplying a predetermined coefficient k1 to the differential voltage $\Delta V$, to the signal level VB1 of the direct current interval of the intermittent rectangular wave to calculate a new signal level VB2 of the direct current interval, as shown in [Eq. 5] below.

$$VB2 = VB1 \pm k1 \cdot \Delta V \quad [\text{Eq. 5}]$$

The predetermined coefficient k1 is a coefficient obtained by performing statistical process on the various differences between the signal level of the reference voltage and the signal level of the direct current interval of the intermittent rectangular wave, and the various values of the differential voltage between the starting point and the ending point of the direct current interval of the intermittent triangular wave generated with respect to the relevant difference in an aim of having the new signal level of the direct current interval of the intermittent rectangular wave, which is obtained by performing the calculation as in [Eq. 5] using the coefficient k1, equal to the signal level of the reference voltage.

Figure 6:
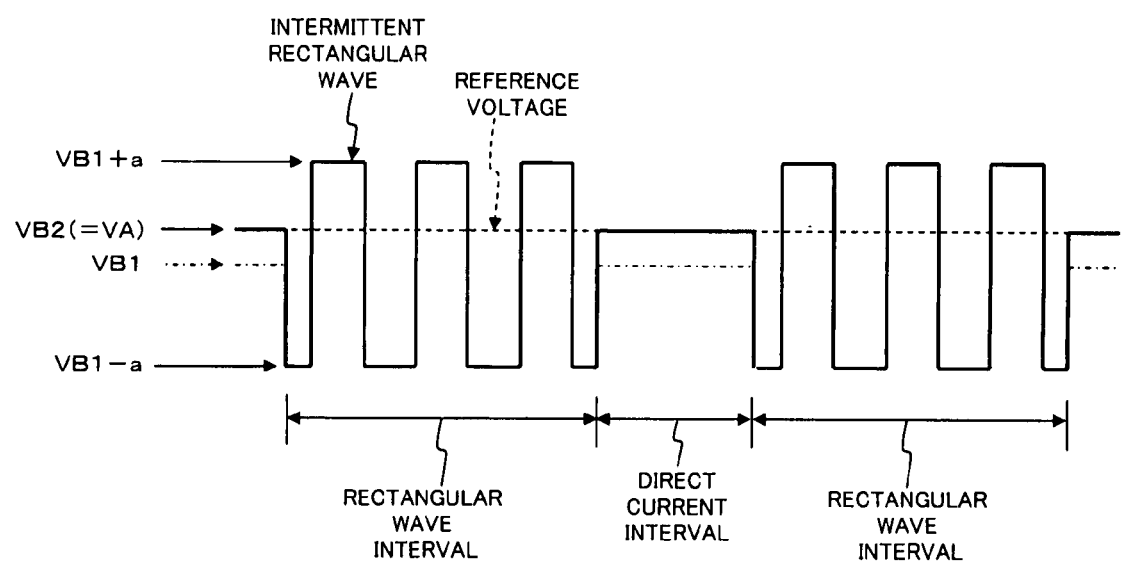
FIG. 6 is an explanatory view showing the intermittent rectangular wave in which the signal level of the direct current interval is corrected.

The intermittent rectangular wave generated in the rectangular wave generation circuit 111 is subjected to the correction of having the signal level of the direct current interval as the signal level VB2 calculated in the triangular wave correcting circuit 112, that is, the correction of changing the signal level of the direct current interval from VB1 to VB2, thereby generating the intermittent rectangular wave, as shown in FIG. 6.

Figure 7:
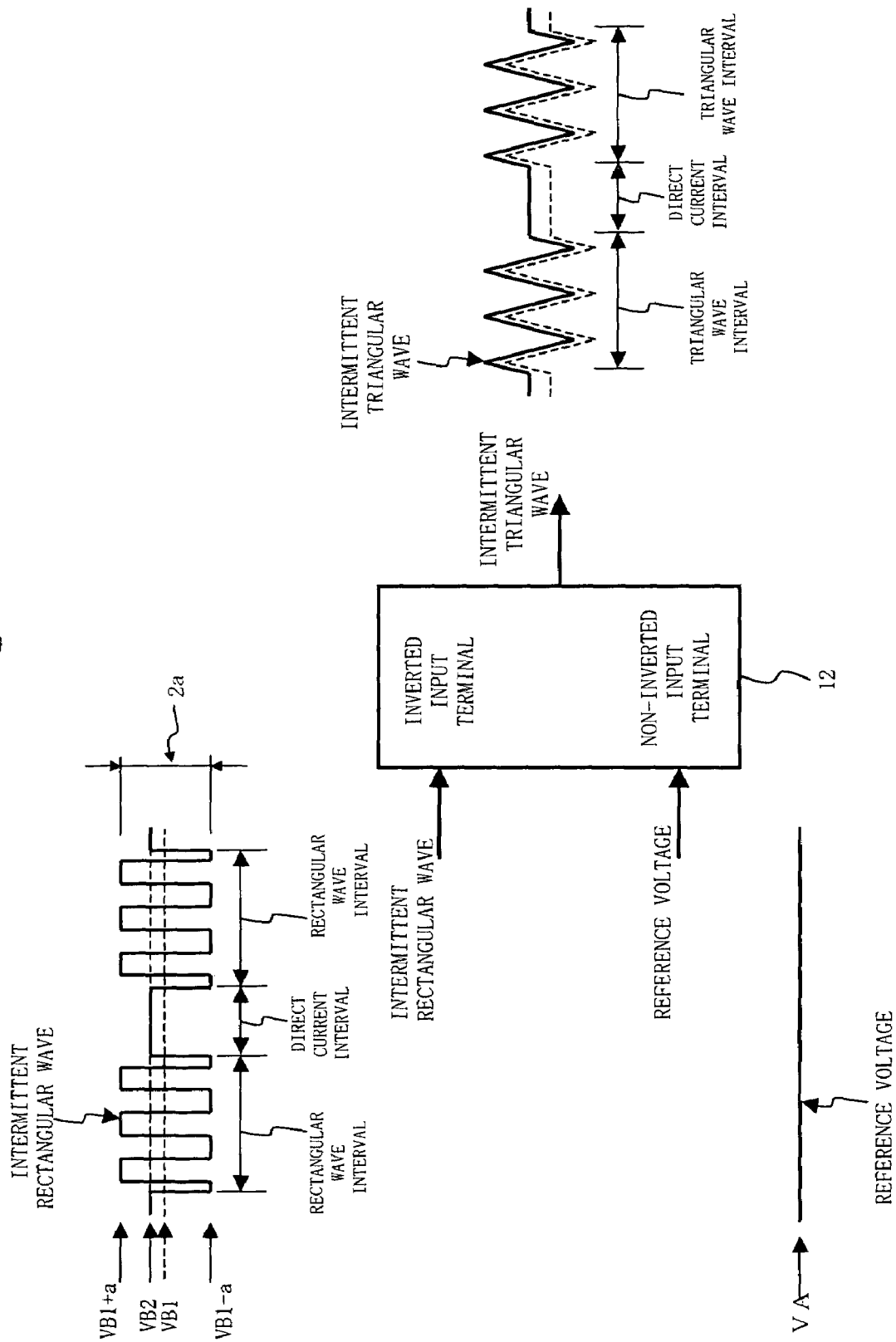
FIG. 7 is an explanatory view showing the intermittent triangular wave output when the corrected intermittent rectangular wave is input to the integration circuit.

The intermittent rectangular wave shown in FIG. 6 is equal to the signal level VA of the reference voltage in the direct current voltage, but if the intermittent rectangular wave shown in FIG. 6 is input to the integration circuit 12, the intermittent triangular wave in which the offset is generated in the triangular wave interval but the drift in the direct current interval is not produced, as shown in FIG. 7, is output since no correction is made in the rectangular wave interval.

Figure 8:
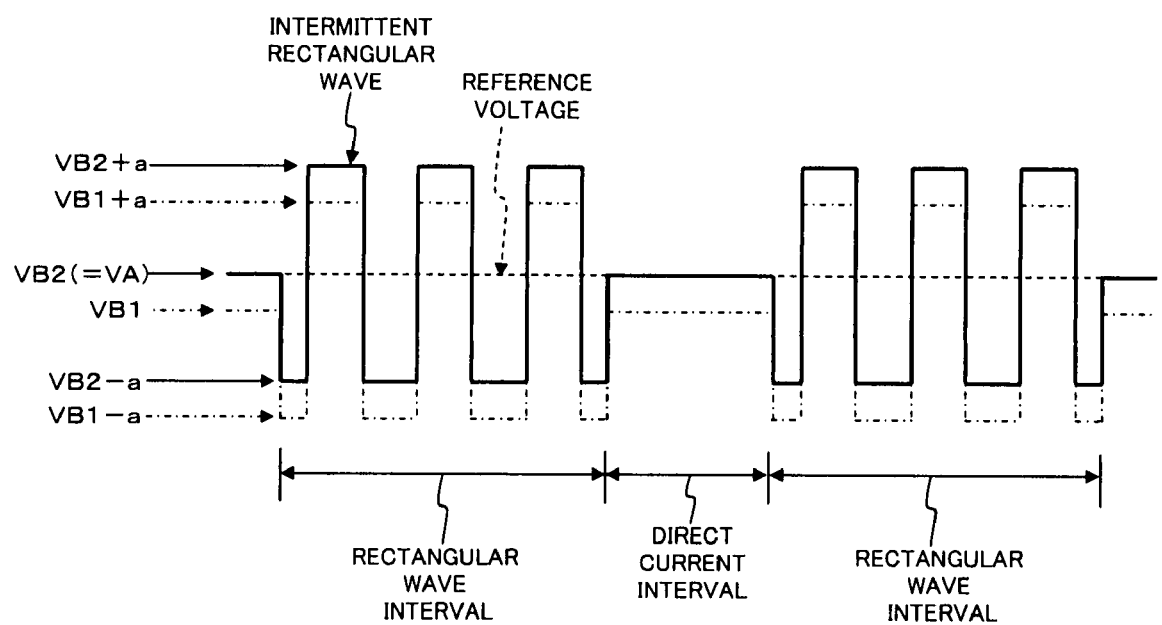
FIG. 8 is an explanatory view showing the intermittent rectangular wave in which the offset level is corrected.

In the above description, the intermittent rectangular wave as shown in FIG. 6 is generated by performing a correction of changing the signal level of the direct current interval of the intermittent rectangular wave generated in the rectangular wave generation circuit 111 from VB1 to VB2, but the correction of changing the signal level in the rectangular wave interval by the difference between VB1 and VB2 may be performed, instead of limiting the correction only to the direct current interval, thereby generating the intermittent rectangular wave, as shown in FIG. 8.

Figure 13:
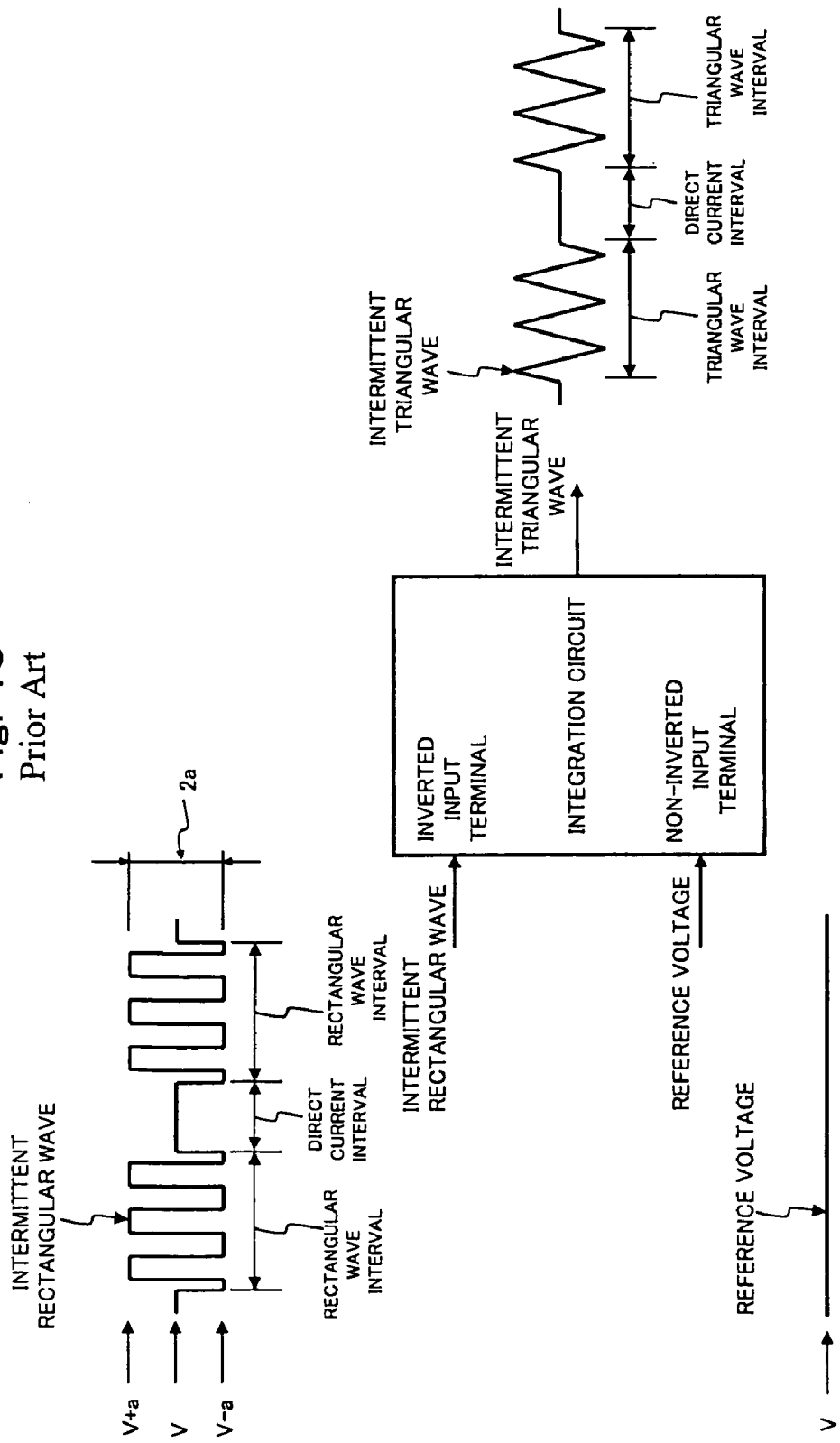
FIG. 13 is an explanatory view of an example of a prior art, showing input and output of an integration circuit of when the signal level of a reference voltage and the signal level of the direct current interval of the intermittent rectangular wave are the same.
Figure 14:
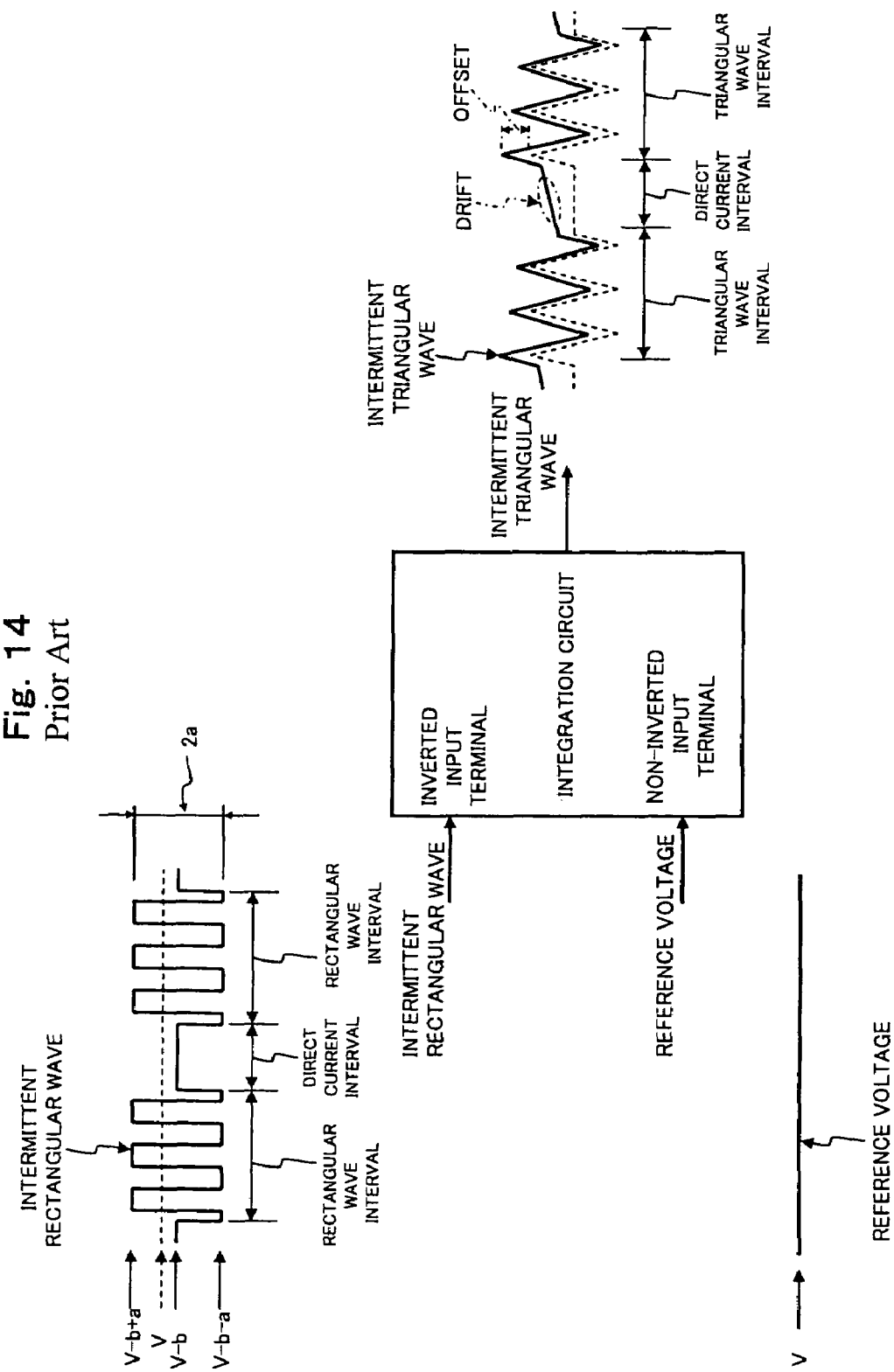
FIG. 14 is an explanatory view of an example of a prior art, showing input and output of the integration circuit of when the signal level of the reference voltage and the signal level of the direct current interval of the intermittent rectangular wave are different.

That is, the correction corrects the offset level of the intermittent rectangular wave. The intermittent rectangular wave shown in FIG. 8 is corrected so as to be equal to the signal level VA of the reference voltage in the direct current interval and so as to have the reference voltage VA as the central voltage in the rectangular wave interval, and thus if the intermittent rectangular wave as shown in FIG. 8 is input to the integration circuit 12, the intermittent triangular wave in which the offset is not generated in the triangular wave interval and the drift is not produced in the direct current interval, that is, the intermittent triangular wave at the output of the integration circuit shown in FIG. 13 is output.

According to the above described correcting process, the signal level VB2 is normally equal to the reference voltage VA, but the above described correcting process in the triangular wave correcting circuit 112 is executed for each process of the rectangular wave generation circuit 111 since a difference may be created between the reference voltage VA and the signal level VB2 by other factors.

Figure 9:
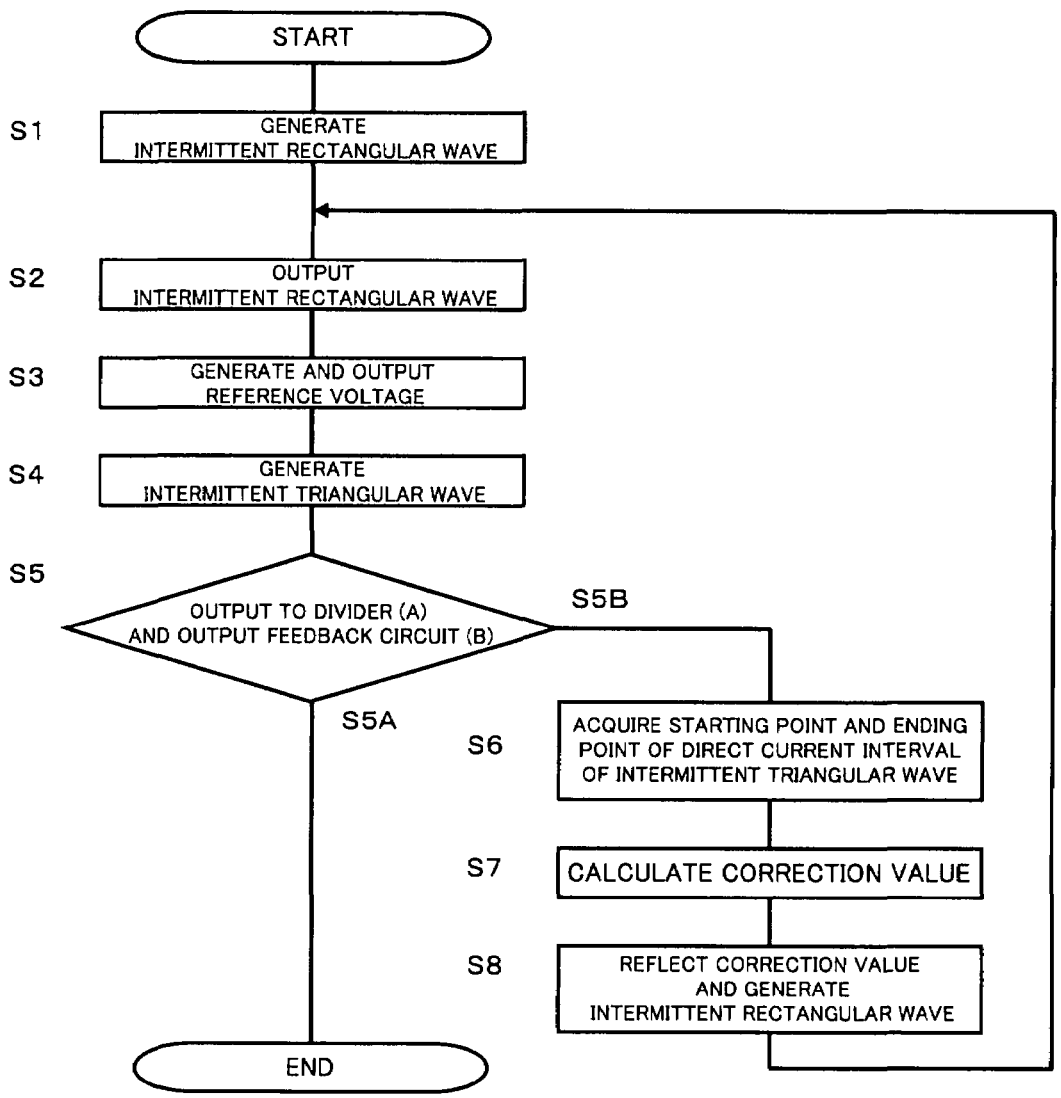
FIG. 9 is a flow chart explaining the triangular wave generating operation of FM-CW radar.

The triangular wave generating operation in the triangular wave generation circuit 1 of FM-CW radar will now be described based on the flow chart shown in FIG. 9.

The intermittent rectangular wave is generated in the rectangular wave generation circuit 111 (S1), the intermittent rectangular wave is output (S2), and the reference voltage is generated in the reference voltage generation circuit 13 and output (S3).

The output intermittent rectangular wave and the reference voltage are input to the integration circuit 12. In the integration circuit 12, the intermittent rectangular wave and the reference voltage each pass through the voltage follower 122, and thereafter the intermittent rectangular wave is input to the inverted input terminal of the operational amplifier 121 and the reference voltage is input to the non-inverted input terminal of the operational amplifier 121, whereby the intermittent triangular wave is generated and output (S4).

The output intermittent triangular wave is output to the divider 2 and the output feedback circuit 14 via the output circuit 15 (S5).

The intermittent triangular wave output to the divider 2 is divided into the transmitting signal and the local signal in the divider 2, and the transmission and reception process is performed by the FM-CW radar (S5A). The intermittent triangular wave output to the output feedback circuit 14 is sent to the triangular wave correcting circuit 112 (S5B).

In the triangular wave correcting circuit 112, the starting point and the ending point of the direct current interval of the intermittent triangular wave input from the output feedback circuit 14 via the A/D conversion circuit 113 are acquired (S6), and a correction value is calculated by a method that uses [Eq. 5] described above (S7). The intermittent rectangular wave reflecting the calculated correction value is generated in the triangular wave generation circuit 111 (S8).

The accurate intermittent triangular wave signal without waveform distortion is thereby generated.

Another embodiment will now be described. A configuration of correcting the intermittent rectangular wave in the triangular wave correcting circuit 112 has been described in the above embodiment, but a configuration of correcting the reference voltage in the triangular wave correcting circuit 112 may be adopted.

Figure 10:
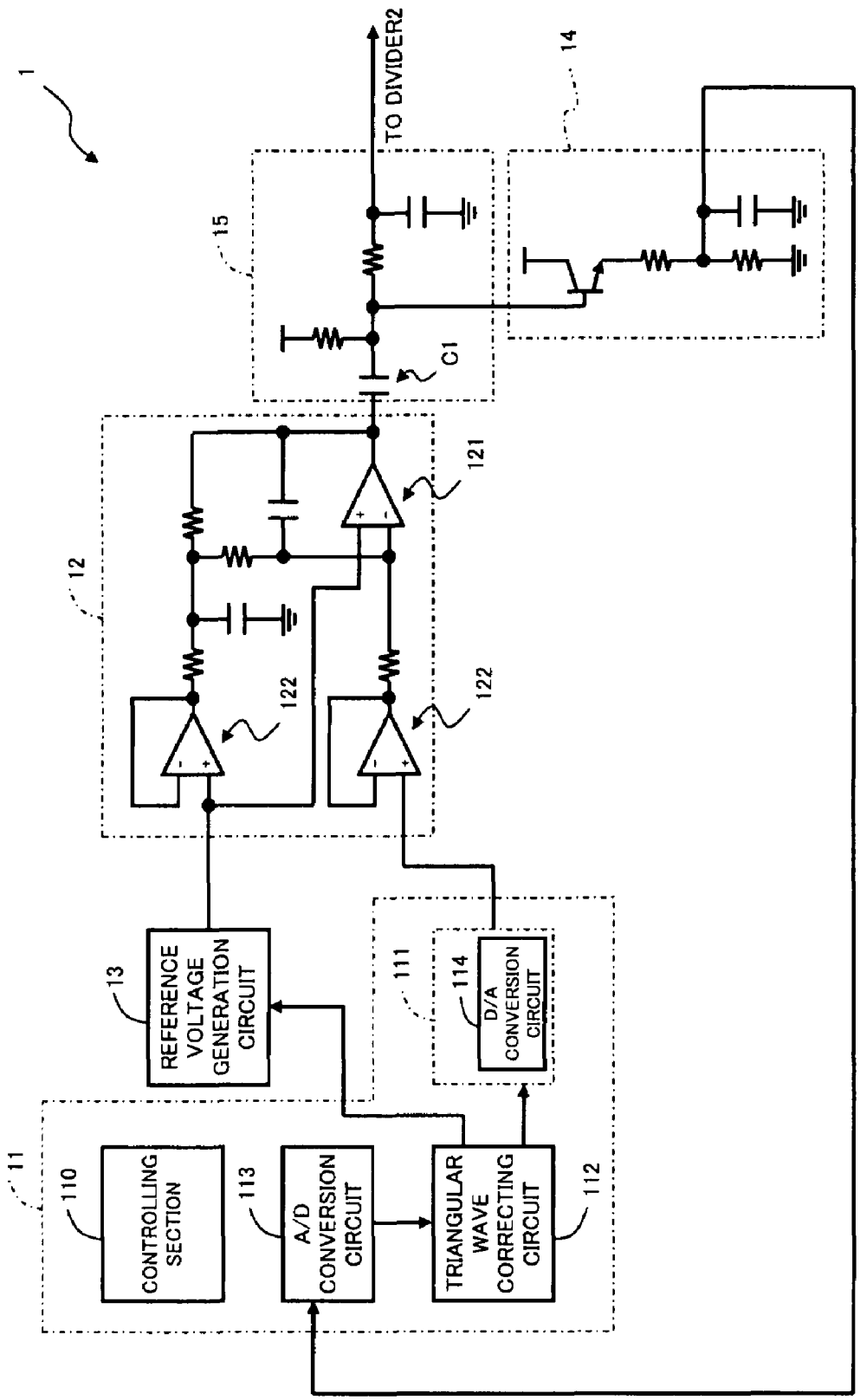
FIG. 10 is a function block configuration diagram of a triangular wave generation circuit capable of variably setting the reference voltage.

Specifically, the triangular wave generation circuit 1 of the present embodiment is configured so that the reference voltage generation circuit 13 variably sets the signal level of the reference voltage, and the reference voltage generation circuit 13 is configured so as to be controlled by the triangular wave correcting circuit 112, as shown in FIG. 10.

Figure 11:
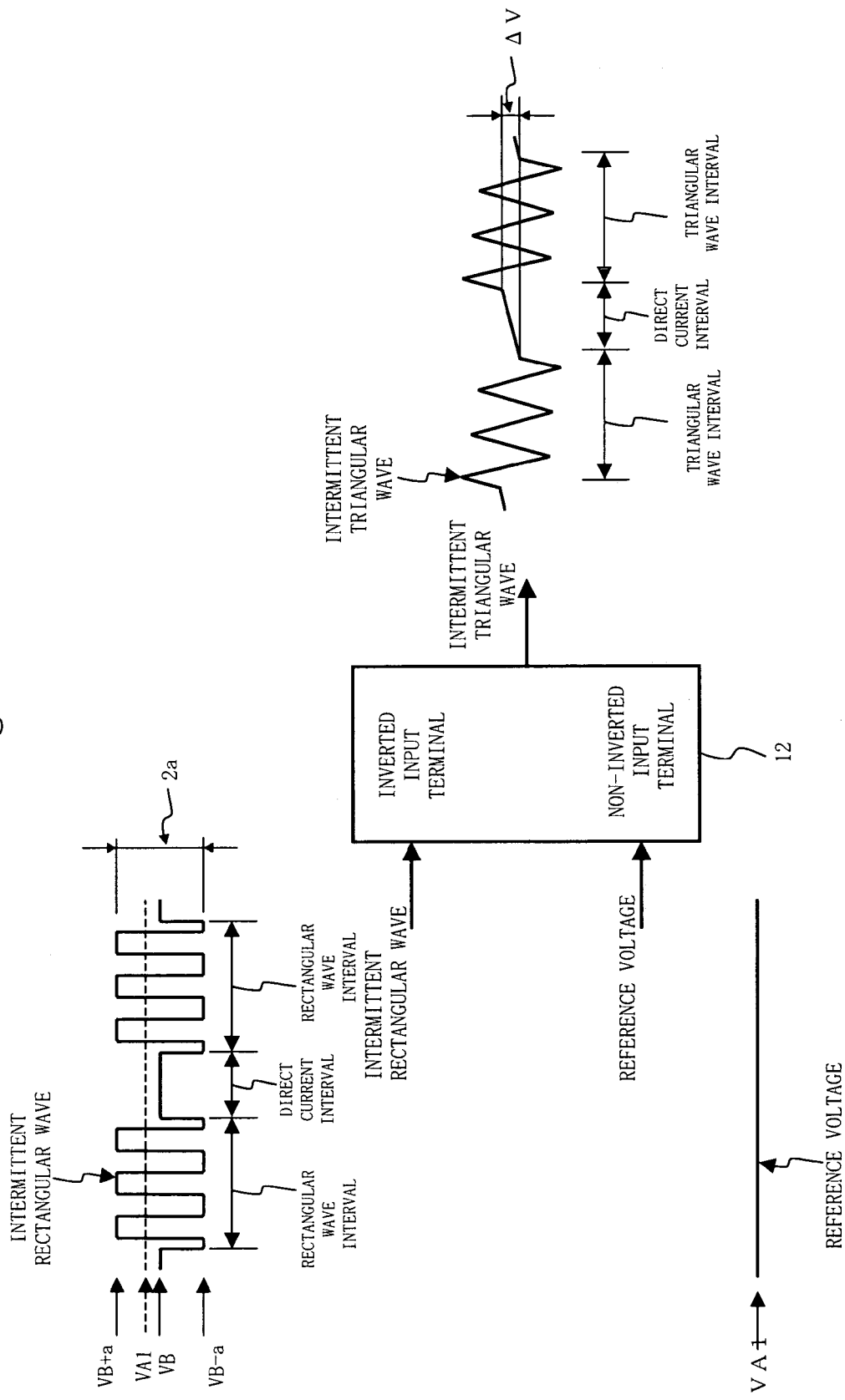
FIG. 11 is an explanatory view showing the intermittent rectangular wave output when the reference voltage before correction is input to the integration circuit.

As shown in FIG. 11, when the intermittent rectangular wave in which the signal level of the direct current interval is VB and the deviation width of the rectangular wave interval is $2a$, and the reference voltage in which the signal level is VA1 are input to the integration circuit 12, the intermittent triangular wave signal in which the differential voltage between the starting point and the ending point of the direct current interval is $\Delta V$ is output according to the difference between the signal level VB of the direct current interval of the intermittent rectangular wave and the signal level VA1 of the reference voltage. In this case, the triangular wave correcting circuit 112 performs the correction of adding or subtracting the value, which is obtained by multiplying a predetermined coefficient k2 to the differential voltage $\Delta V$, to the signal level VA1 of the reference voltage to calculate a new signal level VA2 of the reference voltage, as shown in [Eq. 6] below.

$$VA2 = VA1 \pm k2 \cdot \Delta V \quad [\text{Eq. 6}]$$

The predetermined coefficient k2 is a coefficient obtained by performing statistical process on the various differences between the signal level of the reference voltage and the signal level of the direct current interval of the intermittent rectangular wave, and the various values of the differential voltage between the starting point and the ending point of the direct current interval of the intermittent triangular wave generated with respect to the relevant difference in an aim of having the new signal level of the reference voltage, which is obtained by performing the calculation as in [Eq. 6] using the coefficient k2, equal to the signal level of the direct current interval of the intermittent rectangular wave.

Figure 12:
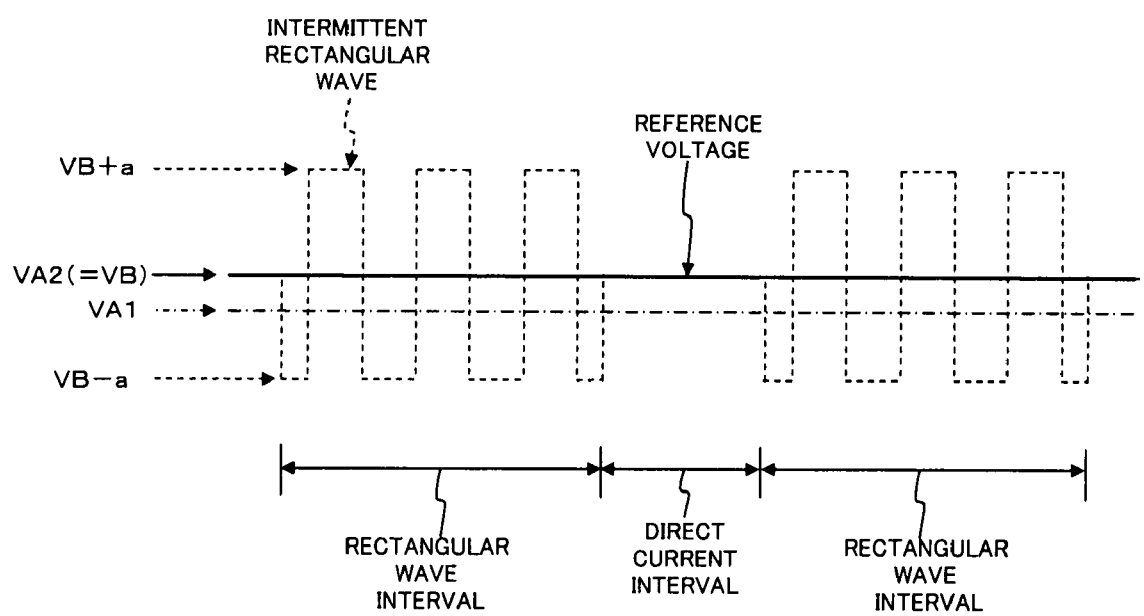
FIG. 12 is an explanatory view showing a reference voltage in which the signal level is corrected to the signal level of the central voltage of the intermittent rectangular wave.

The reference voltage generated in the reference voltage generation circuit 13 is subjected to the correction of having the signal level to the signal level VA2 of the reference voltage calculated in the triangular wave correcting circuit 112, and configures the central voltage of the intermittent rectangular wave, as shown in FIG. 12. The reference voltage VA2 becomes equal to the signal level VB of the direct current interval of the intermittent rectangular wave, and thus if the reference voltage as shown in FIG. 12 is input to the integration circuit 12, the intermittent triangular wave in which the offset is not generated in the triangular wave interval and the drift is not produced in the direct current interval, that is, the intermittent triangular wave at the output of the integration circuit shown in FIG. 13 is output.

The above embodiment is merely an example of the present invention, and it is to be understood that specific configurations and the like of each block may be appropriately changed within the scope of the effects of the present invention.

What is claimed is:

1. A triangular wave generation circuit comprising:
    a rectangular wave generation circuit for generating an intermittent rectangular wave signal in which a rectangular wave interval and a direct current interval of a predetermined level are repeated;
    an integration circuit for generating an intermittent triangular wave signal in which a triangular wave interval and a direct current interval are repeated based on a reference signal and the intermittent rectangular wave signal generated by the rectangular wave generation circuit; and
    a triangular wave correcting circuit for calculating a correction value from a differential voltage between a starting point and an ending point of the direct current interval of the intermittent triangular wave signal output from the integration circuit, the triangular wave correcting circuit performing a correction so that both signal levels of the reference signal and the direct current interval of the intermittent rectangular wave signal become equal to each other based on the correction value.

2. The triangular wave generation circuit according to claim 1, wherein
    the triangular wave correcting circuit calculates a correction value from the differential voltage and corrects the signal level of the direct current interval of the intermittent rectangular wave signal based on the correction value.

3. The triangular wave generation circuit according to claim 1, wherein
    the triangular wave correcting circuit calculates a correction value from the differential voltage and corrects an offset level of the intermittent rectangular wave signal based on the correction value.

4. The triangular wave generation circuit according to claim 1, wherein
    the triangular wave correcting circuit calculates a correction value from the differential voltage and corrects the signal level of the reference signal based on the correction value.

5. The triangular wave generation circuit according to claim 4, wherein
    the triangular wave correcting circuit calculates a correction value from the differential voltage and corrects the signal level of the direct current interval of the intermittent rectangular wave signal based on the correction value.

6. The triangular wave generation circuit according to claim 4, wherein
    the triangular wave correcting circuit calculates a correction value from the differential voltage and corrects an offset level of the intermittent rectangular wave signal based on the correction value.

* * * * *